(12) United States Patent
Kawai et al.

(10) Patent No.: US 11,189,493 B2
(45) Date of Patent: Nov. 30, 2021

(54) SILICON CARBIDE SEMICONDUCTOR DEVICE AND METHOD FOR MANUFACTURING THE SAME

(71) Applicant: DENSO CORPORATION, Kariya (JP)

(72) Inventors: Jun Kawai, Kariya (JP); Kazuhiko Sugiura, Kariya (JP)

(73) Assignee: DENSO CORPORATION, Kariya (JP)

( * ) Notice: Subject to any disclaimer, the term of this patent is extended or adjusted under 35 U.S.C. 154(b) by 85 days.

Patent file contains an affidavit/declaration under 37 CFR 1.130(b).

(21) Appl. No.: 16/260,517

(22) Filed: Jan. 29, 2019

(65) Prior Publication Data
US 2019/0259615 A1 Aug. 22, 2019

(30) Foreign Application Priority Data

Feb. 19, 2018 (JP) .............................. JP2018-027128
Dec. 25, 2018 (JP) .............................. JP2018-240998

(51) Int. Cl.
*H01L 29/16* (2006.01)
*H01L 29/45* (2006.01)
(Continued)

(52) U.S. Cl.
CPC ...... *H01L 21/0485* (2013.01); *H01L 29/1608* (2013.01); *H01L 29/45* (2013.01); *H01L 29/7827* (2013.01)

(58) Field of Classification Search
CPC . H01L 29/45; H01L 21/0485; H01L 29/1608; H01L 21/268; H01L 29/7827
See application file for complete search history.

(56) References Cited

U.S. PATENT DOCUMENTS 6,087,245 A 7/2000 Yamazaki et al.
6,420,246 B1 7/2002 Yamazaki et al.
(Continued)

FOREIGN PATENT DOCUMENTS

JP 2000-277448 A 10/2000
JP 2006-024880 A 1/2006
JP 2008-135611 A 6/2008

OTHER PUBLICATIONS

Guo Hui et al 2007 Chinese Phys. 16 1753 (Year: 2007).*
(Continued)

*Primary Examiner* — Shih Tsun A Chou
(74) *Attorney, Agent, or Firm* — Posz Law Group, PLC

(57) ABSTRACT

A silicon carbide semiconductor device includes a silicon carbide semiconductor substrate having a front surface and a rear surface, and an ohmic electrode in ohmic contact with silicon carbide of at least one of the front surface or the rear surface of the silicon carbide semiconductor substrate. The ohmic electrode is made of Ni containing 0.1 wt % or more and 15 wt % or less of P as an impurity. The ohmic electrode contains Ni silicide including NiSi. The ohmic electrode further contains $Ni_5P_2$ in the Ni silicide. A method for manufacturing the silicon carbide semiconductor device includes forming a metal thin film on the silicon carbide that is to be in ohmic contact with the ohmic electrode, and forming the ohmic electrode by laser annealing that includes irradiating the metal thin film with laser light and reacting the Ni with Si in the silicon carbide to generate Ni silicide.

7 Claims, 9 Drawing Sheets

(51) Int. Cl.
*H01L 21/04* (2006.01)
*H01L 29/78* (2006.01)

(56) References Cited

U.S. PATENT DOCUMENTS

| | | |
|---|---|---|
| 6,821,710 B1 | 11/2004 | Yamazaki et al. |
| 2002/0106841 A1* | 8/2002 | Yamazaki ............ H01L 21/2022 438/149 |
| 2005/0255626 A1 | 11/2005 | Yamazaki et al. |
| 2006/0270225 A1* | 11/2006 | Kawai ................. H01L 21/0485 438/682 |
| 2007/0161164 A1 | 7/2007 | Yamazaki et al. |
| 2010/0044721 A1* | 2/2010 | Fujikawa .......... H01L 21/67109 257/77 |
| 2013/0062624 A1 | 3/2013 | Tsuchiya et al. |
| 2013/0285070 A1* | 10/2013 | Kawai ................. H01L 21/0455 257/77 |
| 2014/0051241 A1 | 2/2014 | Kinoshita et al. |
| 2014/0134817 A1 | 5/2014 | Tsuchiya et al. |
| 2015/0079781 A1 | 3/2015 | Kawai et al. |
| 2019/0157397 A1* | 5/2019 | Odekirk ............. H01L 29/1608 |

OTHER PUBLICATIONS

"Formation of Ohmic Electrode of SiC Device by Laser Anneal / Formation of Back Side Electrode with Ni-P Plating Film" Advanced Power Semiconductors Journal, Abstracts of 4th Lecture Meeting, The Japan Society of Applied Physics Advanced Power Semiconductors, pp. 169-170. Nov. 1, 2017 (and English machine translation).

\* cited by examiner

SILICON CARBIDE SEMICONDUCTOR DEVICE AND METHOD FOR MANUFACTURING THE SAME

CROSS REFERENCE TO RELATED APPLICATIONS

The present application claims the benefit of priority from Japanese Patent Application No. 2018-27128 filed on Feb. 19, 2018 and Japanese Patent Application No. 2018-240998 filed on Dec. 25, 2018. The entire disclosures of the above applications are incorporated herein by reference.

STATEMENT DESIGNATING GRACE PERIOD INVENTOR DISCLOSURE

At least part of the presently claimed invention was disclosed in the following: *Formation of Ohmic Electrode of SiC Device by Laser Anneal/Formation of Back Side Electrode with Ni-P Plating Film*, Advanced Power Semiconductors Journal, Abstracts of 4$^{th}$ Lecture Meeting, The Japan Society of Applied Physics Advanced Power Semiconductors, pages 169-170 (Nov. 1, 2017). This is a grace period inventor-originated disclosure disclosed within one year before the effective filing date hereof. The disclosure: (1) was made one year or less before the effective filing date of the claimed invention; and (2) names the joint inventors as authors.

TECHNICAL FIELD

The present disclosure relates to a silicon carbide (hereinafter referred to as SiC) semiconductor device capable of reducing a contact resistance of an ohmic electrode included in a semiconductor element formed of SiC and a method for manufacturing the SiC semiconductor device.

BACKGROUND

When forming a semiconductor element such as a vertical power device using a SiC substrate, an ohmic electrode having reduced contact resistance may be used for an electrode for connecting the device to an electric circuit or the like. Particularly, the ohmic electrode may be used for a drain electrode on a rear surface of the substrate.

Further, in order to reduce an on-resistance of the device, various impurity layers constituting the device, electrodes and the like are formed on a front surface of the SiC substrate, and then the rear surface of the SiC substrate is ground to thin the SiC substrate so as to reduce substrate resistance. In this case, it is necessary to form the ohmic electrode on the rear surface after grinding the rear surface of the SiC substrate.

However, since various impurity layers and electrodes constituting the device are already formed on the front surface of the SiC substrate when forming the ohmic electrode, thermal damage to the front surface needs to be prevented. In order to prevent thermal damage, laser annealing technique capable of performing local heating may be used.

For example, as a method for forming an ohmic electrode using laser annealing or the like, activating an ion-implanted impurity by the laser annealing has been known. However, the ion implanting apparatus is likely to be expensive, and the ion implantation process itself is also likely to be expensive. Therefore, it is desirable to obtain an ohmic electrode without performing an ion implantation process.

JP 2013-214657 A (which corresponds to US 2013/0285070 A1 and US 2015/0079781 A1) proposed that Ni (nickel) or the like is formed as an electrode material on SiC and laser annealing is performed to form a silicide layer silicided by bonding with Si contained in SiC and thereby to form an ohmic junction.

SUMMARY

However, desired ohmic characteristics may not be obtained or adhesion strength between the SiC and the electrode may be insufficient only by forming the silicide layer.

It is an object of the present disclosure to provide a SiC semiconductor device capable of obtaining better ohmic characteristics and increasing adhesion strength between the SiC and the electrode, and to provide a method for manufacturing the SiC semiconductor device.

According to a first aspect of the present disclosure, a silicon carbide semiconductor device includes a silicon carbide semiconductor substrate and an ohmic electrode. The silicon carbide semiconductor substrate has a front surface and a rear surface. The ohmic electrode is in ohmic contact with silicon carbide of at least one of the front surface or the rear surface of the silicon carbide semiconductor substrate. The ohmic electrode is made of Ni containing 0.1 wt % or more and 15 wt % or less of P as an impurity. The ohmic electrode contains Ni silicide including NiSi. The ohmic electrode further contains $Ni_5P_2$ in the Ni silicide.

As described above, the ohmic electrode containing $Ni_5P_2$ and NiSi as Ni silicide has low contact resistance and high adhesion strength with SiC. Accordingly, a SiC semiconductor device having desired ohmic characteristics and high adhesion strength between the SiC and the electrode can be obtained.

According to a second aspect of the present disclosure, a method for manufacturing the silicon carbide semiconductor device includes forming a metal thin film on the silicon carbide that is to be in ohmic contact with the ohmic electrode, and forming the ohmic electrode by laser annealing. The metal thin film is made of Ni containing 0.1 wt % or more and 15 wt % or less of P as an impurity. The laser annealing includes irradiating the metal thin film with laser light and reacting the Ni with Si in the silicon carbide to generate Ni silicide.

As described above, the ohmic electrode is formed by using, as the metal thin film, a material in which P as an impurity is included in Ni forming silicide, and by performing laser annealing for the material. Accordingly, desired ohmic characteristics can be obtained, and high adhesion strength between the SiC and the electrode can be obtained. Further, in the laser annealing, local annealing in a short time can be performed, so that thermal damage to the semiconductor device can be suppressed.

BRIEF DESCRIPTION OF THE DRAWINGS

The above and other objects, features and advantages of the present disclosure will become more apparent from the following detailed description made with reference to the accompanying drawings in which.

DETAILED DESCRIPTION

Figure 1:
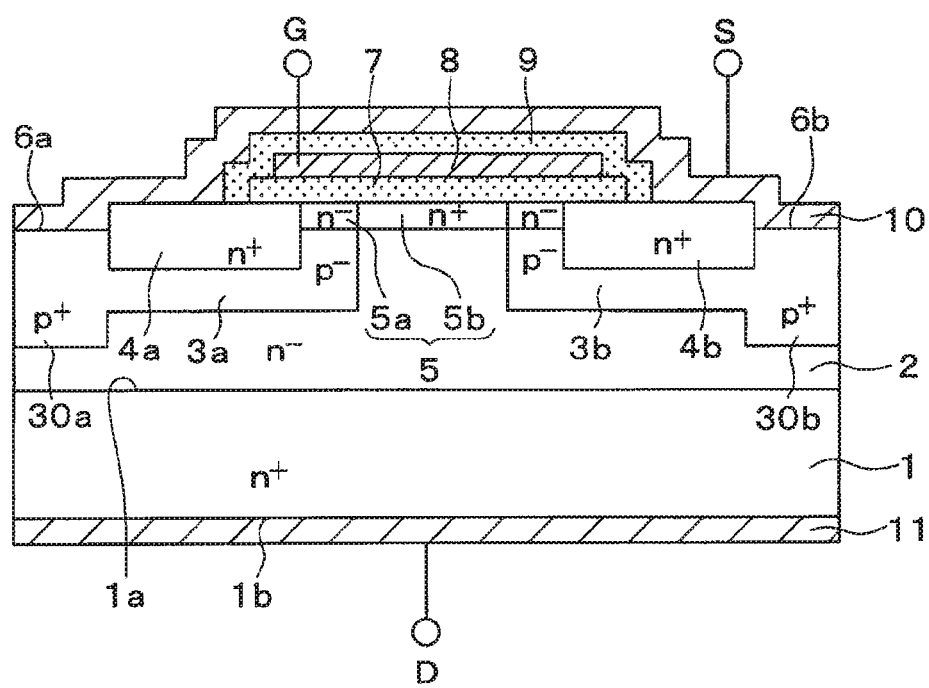
FIG. 1 is a cross-sectional view of a SiC semiconductor device according to a first embodiment.

Hereinafter, embodiments of the present disclosure will be described with reference to the drawings. In the following embodiments, the same or equivalent parts are denoted by the same reference numerals.

First Embodiment

Hereinafter, a first embodiment of the present disclosure will be described. A SiC semiconductor device according to the present embodiment will be described with reference to FIG. 1. In the present embodiment, a SiC semiconductor device having a planar vertical power MOSFET as a SiC semiconductor element will be described. For example, the present SiC semiconductor device may be applied to an inverter.

The vertical power MOSFET includes an $n^+$ type SiC substrate 1. The $n^+$ type SiC substrate 1 has an upper surface as a main front surface 1a and a lower surface opposite to the main front surface 1a as a rear surface 1b. The $n^+$ type SiC substrate 1 is made of single crystal SiC. For example, the $n^+$ type SiC substrate 1 has an impurity concentration of $1\times10^{18}$ cm$^{-3}$.

Above the main front surface 1a of the $n^+$ type SiC substrate 1, an $n^-$ type epitaxial layer 2 is stacked. The $n^-$ type epitaxial layer 2 is made of SiC having a lower dopant concentration than the $n^+$ type SiC substrate 1.

In a predetermined region of a surface layer portion of the $n^-$ type epitaxial layer 2, $p^-$ type base regions 3a and 3b each having a predetermined depth are formed apart from each other. Further, the $p^-$ type base regions 3a and 3b are provided with deep base layers 30a and 30b each having a thickness greater than the $p^-$ type base regions 3a and 3b. That is, each of the deep base layers 30a and 30b corresponds to a thicker part of the $p^-$ type base regions 3a and 3b. The deep base layers 30a and 30b are formed in portions which do not overlap $n^+$ type source regions 4a and 4b, which will be described later. The thicker portions of the $p^-$ type base regions 3a and 3b, where the deep base layers 30a and 30b are formed, have impurity concentrations greater than thinner portions where the deep base layers 30a and 30b are not formed. By forming such deep base layers 30a and 30b, electric field intensity between the $n^+$ type SiC substrate 1 and the deep base layers 30a and 30b are increased, and avalanche breakdown is likely to occur in these portions.

In a predetermined region of a surface layer portion of the $p^-$ type base region 3a, an $n^+$ type source region 4a shallower than the $p^-$ type base region 3a is formed. In a predetermined region of a surface layer portion of the $p^-$ type base region 3b, an $n^+$ type source region 4b shallower than the $p^-$ type base region 3b is formed.

Further, on surface portions of the $n^-$ type epitaxial layer 2 and the $p^-$ type base regions 3a, 3b between the $n^+$ type source region 4a and 4b, an n type SiC layer 5 is extended. The n type SiC layer 5 includes an $n^-$ type layer 5a and an $n^+$ type layer 5b. In other words, the n type SiC layer 5 connects the source regions 4a, 4b and the $n^-$ type epitaxial layer 2 in the surface portions of the $p^-$ type base regions 3a and 3b. The n type SiC layer 5 functions as a channel formation layer on a device surface during operation of the device. Hereinafter, the n type SiC layer 5 is referred to as a surface channel layer.

The surface channel layer 5 is formed by, for example, ion implantation of an n type impurity into the surface portions of the $n^-$ type epitaxial layer 2 and the $p^-$ type base regions 3a and 3b. Dopant concentration of the $n^-$ type layer 5a disposed on the $p^-$ type base regions 3a, 3b in the surface channel layer 5 is equal to or lower than dopant concentration of the $n^-$ type epitaxial layer 2 and the $p^-$ type base regions 3a and 3b. In addition, dopant concentration of the $n^+$ type layer 5b formed on the surface portion of the $n^-$ type epitaxial layer 2 is higher than that of the $n^-$ type epitaxial layer 2. As a result, lower on-resistance is achieved.

Recesses 6a and 6b are formed in the surface portions of the $p^-$ type base regions 3a, 3b and the $n^+$ type source regions 4a, 4b. The deep base layers 30a, 30b having higher p type impurity concentration are exposed from bottoms of the recesses 6a and 6b.

A gate insulation film 7 is formed on an upper surface of the surface channel layer 5 and upper surfaces of the $n^+$ type source regions 4a and 4b. For example, the gate insulation film 7 is made of a silicon oxide film or the like. Further, a gate electrode 8 is formed on the gate insulation film 7, and the gate electrode 8 is covered with an insulation film 9 made of a silicon oxide film or the like. As described above, the vertical power MOSFET as the SiC semiconductor element is formed on the $n^+$ type SiC substrate 1.

On the front surface 1a side of the $n^+$ type SiC substrate 1, a source electrode 10 is formed to cover an upper surface of the insulation film 9, and is connected to the $n^+$ type source regions 4a, 4b and the $p^-$ type base regions 3a, 3b.

On the rear surface 1b of the $n^+$ type SiC substrate 1, a drain electrode 11 is formed. The drain electrode 11 is an ohmic electrode that is in ohmic contact with the rear surface $1b$ of the n$^+$ type SiC substrate 1. The drain electrode 11 is made of a metal material that generates a metal reactant of at least one of silicide or carbide by reacting with SiC, and the drain electrode 11 is made of the metal material at least at a part of which contains an impurity. The drain electrode 11 is formed by laser annealing a Ni (nickel) layer into which P (phosphorus) serving as an n type impurity is introduced (hereinafter referred to as a Ni—P layer). The P concentration in the Ni layer is within a relatively low concentration range of 0.1 to 15 wt %. The drain electrode 11 contains metal Ni, Ni$_5$P$_2$, NiSi$_2$, and NiSi. The drain electrode 11 contains at least Ni$_5$P$_2$ and NiSi so as to improve crystallinity.

The metal Ni corresponds to unreacted Ni, for example, not subjected to silicidation. NiSi$_2$ is generally formed as Ni silicide. NiSi$_2$ is generated when performing laser annealing using Ni as an electrode material. Ni$_5$P$_2$ is generated by introducing P as the n type impurity. Although the function of Ni$_5$P$_2$ is not clear, the Ni$_5$P$_2$ is presumed to function as a catalyst for the generation of NiSi. NiSi is a silicide having a smaller contact resistance with SiC than NiSi$_2$. The NiSi is generated by introducing impurities into the electrode material and performing laser annealing.

Although Ni is used as the electrode material in the present embodiment, other electrode material may be added to Ni. In that case, a plurality of electrode materials including Ni may be stacked or mixed. When the plurality of electrode materials are used, at least Ni contains P, and all of the electrode materials do not have to contain P. For example, when the Ni—P layer is used, Mo (molybdenum) layer may be formed on SiC and the Ni—P layer may be formed thereon. As an electrode material other than Mo, a material that reacts with SiC to generate carbide such as Ti (titanium), Nb (niobium), Ta (tantalum), W (tungsten), or the like may be applied.

With the above structure, the SiC semiconductor device including the vertical semiconductor element according to the present embodiment is configured.

Next, a method for manufacturing the vertical power MOSFET shown in FIG. 1 will be described. Hereinafter, a method for forming the drain electrode 11 will be mainly described.

The vertical power MOSFET according to the present embodiment is manufactured through each manufacturing process shown in FIGS. 2A to 2D.

Figure 2A:
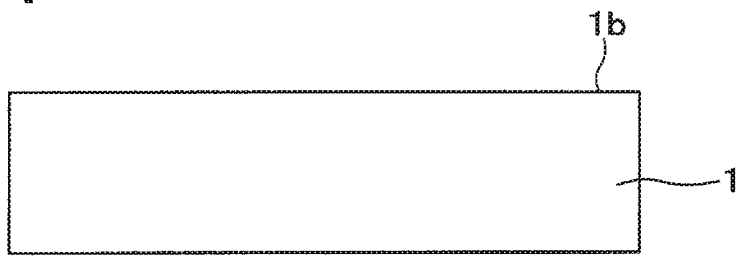
FIGS. 2A to 2D are cross-sectional views each showing a step of forming a drain electrode in the SiC semiconductor device shown in FIG. 1.

As shown in FIG. 2A, an n$^+$ type SiC substrate 1 having a thickness of 350 μm, for example, is provided. The n$^+$ type SiC substrate 1 is manufactured by, for example, slicing a SiC ingot doped with an n type impurity and then polishing. Although not illustrated, a device forming step of forming at least a part of components of the semiconductor element on the front surface side of the n$^+$ type SiC substrate 1 is performed. That is, after the n$^-$ type epitaxial layer 2 is epitaxially grown, the p$^-$ type base regions 3$a$ and 3$b$, the deep base layers 30$a$ and 30$b$, the n$^+$ type source regions 4$a$ and 4$b$, the surface channel layer 5 are formed by ion implantation using unillustrated mask. Further, by forming the gate insulation film 7, the gate electrode 8, the insulation film 9, the source electrode 10, and the like, each component of the vertical power MOSFET as a device is formed.

Thereafter, although not illustrated, a part of a rear surface 1$b$ portion of the n$^+$ type SiC substrate 1 is removed by grinding and polishing to thin the n$^+$ type SiC substrate 1. For example, the rear surface 1$b$ of the n$^+$ type SiC substrate 1 is directed to the front side, and an opposite surface is attached to a glass substrate. Thereafter, by performing CMP (Chemical Mechanical Polishing) or the like, a part of the rear surface 1$b$ portion of the n$^+$ type SiC substrate 1 is removed. Then, by performing the steps shown in FIGS. 2B to 2D, the drain electrode 11 is formed on the rear surface 1$b$ of the thinned n$^+$ type SiC substrate 1.

Figure 2B:
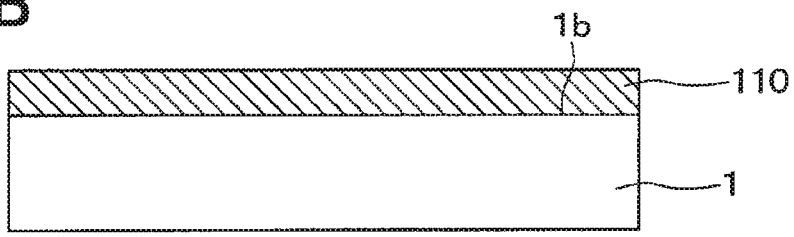

Specifically, as shown in FIG. 2B, a metal thin film 110 containing impurities is formed on the rear surface 1$b$ of the thinned n$^+$ type SiC substrate 1. As the metal thin film 110, a Ni—P layer is used. After the rear surface 1$b$ of the n$^+$ type SiC substrate 1 is treated and activated, the Ni—P layer is formed by electroless plating. The P concentration in the Ni—P layer is within a relatively low concentration range of 0.1 to 15 wt %. The thickness of the Ni—P layer is, for example, 50 to 300 nm.

In order to form carbide with SiC, the Ni—P layer may be formed after forming a Mo layer on the rear surface 1$b$. When forming the Mo layer, the content of Ni is preferably more than Mo in molar ratio. For example, molar ratio of Ni to Mo is 1:1 to 2:1. Further, the metal thin film 110 is not limited to the stacked structure of the Mo layer and the Ni—P layer. P may be contained in mixed metal of Ni and Mo.

Figure 2C:
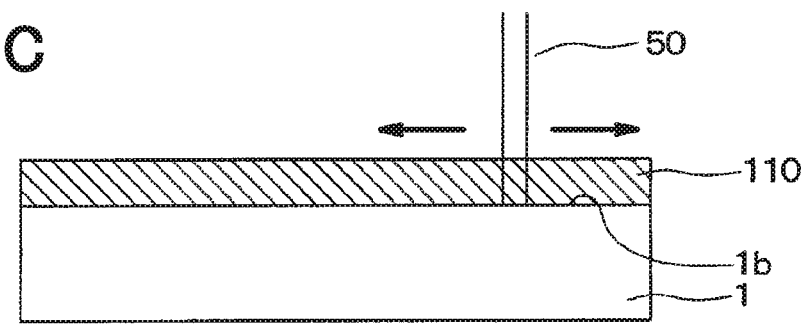

Next, as shown in FIG. 2C, laser annealing is performed by irradiating the metal thin film 110 with laser light 50. For example, the n$^+$ type SiC substrate 1 on which the metal thin film 110 is formed is scanned on XY plane using a solid state laser such as an LD pumped solid state laser, and the laser light 50 is irradiated on the rear surface 1$b$ of the n$^+$ type SiC substrate 1. In this way, by performing local annealing such as laser annealing, the drain electrode 11 can be ohmically joined by a low temperature process that can suppress temperature rising of the region not irradiated with the laser. Therefore, it is possible to suppress the influence on the device formed on the front surface 1$a$ of the n$^+$ type SiC substrate 1. Note that the low temperature process referred to here is a process under a temperature at which thermal damage to the device can be suppressed. Specifically, a temperature at which aluminum (Al), which is generally used as a wiring material of the device, does not melt in the process may be considered. More specifically, a temperature equal to or less than 400 degrees Celsius (° C.) may be considered.

At this time, for example, a light using a solid laser having a fundamental wavelength of 1064 n and converted into a wavelength of 355 nm, which is a third harmonic wave, or 266 nm, which is a fourth harmonic wave, by a wavelength conversion adapter is used as the laser light 50. With these wavelengths, the laser light 50 does not pass through the SiC. Further, energy density of the laser light 50 is 1.4 J/cm$^2$ or more, for example, 1.4 to 3.0 J/cm$^2$.

As a result, a metal element constituting the metal thin film 110, in this case, Ni and Si contained in the n$^+$ type SiC substrate 1 undergo a silicidation reaction, and metal silicide is generated. When the metal thin film 110 contains a metal element to be carbided such as Mo, the metal element reacts with C contained in the n$^+$ type SiC substrate 1 to generate metal carbide. When Mo is contained, Mo carbide is formed.

Figure 2D:
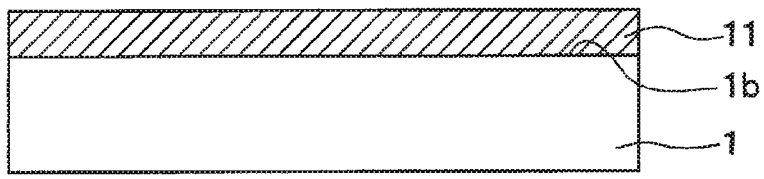

In this way, the drain electrode 11 as shown in FIG. 2D is formed. Although not illustrated, Ti as a barrier metal, eutectic material Ni in soldering, Au (gold) as an oxidation protective agent, and the like may be sequentially stacked in accordance with necessity. Then, a dicing tape is attached to the drain electrode 11 and peeled off from the glass substrate. Thereafter, dicing is performed to divide it into chip units, thereby completing the SiC semiconductor device.

As described above, the drain electrode 11 is formed by laser annealing the metal thin film 110 in which impurities are contained in the metal generating at least one of the silicide or the carbide. Therefore, desired ohmic characteristics can be obtained, and high adhesion strength between the SiC and the electrode can be obtained. These effects will be described with reference to the following experimental results.

Figure 3:
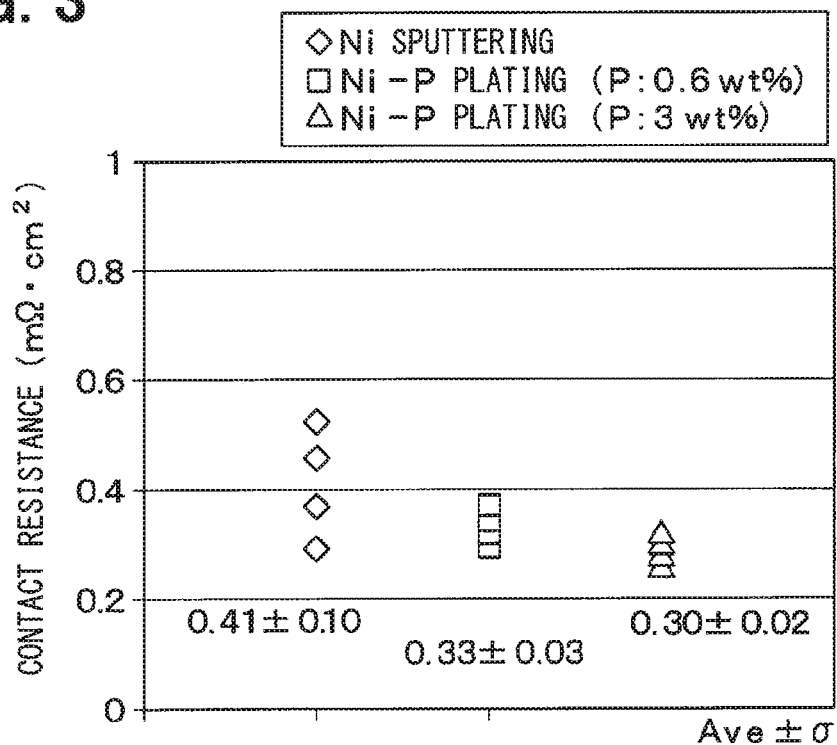
FIG. 3 is a diagram showing contact resistances in a case where laser annealing is performed after forming a Ni layer and a case where laser annealing is performed after a Ni—P layer is formed.

First, contact resistance between SiC and electrode material was investigated in a case where the Ni—P layer was formed by electroless plating as an electrode material and then laser annealing was performed, and in a case where the Ni layer used as a conventional electrode material was formed by sputtering and then laser annealing was performed. Regarding the Ni—P layer, a case where the P concentration was 0.6 wt % and a case where the P concentration was 3 wt % were examined. Regarding laser annealing, a duty ratio of the laser light was adjusted so that a laser energy would be 8 W. FIG. 3 is a diagram showing the results.

As shown in FIG. 3, when the Ni layer was used, the contact resistance was lowered in some cases. An averaged contact resistance of a plurality of experimental results was 0.41 mΩ·cm$^2$, and a variation was ±0.10 mΩ·cm$^2$. On the other hand, when the Ni—P layer was used and the P concentration was 0.6 wt %, an averaged contact resistance of a plurality of experimental results was 0.33 mΩ·cm$^2$, and a variation was ±0.03 mΩ·cm$^2$. When the Ni—P layer was used and the P concentration was 3 wt %, an averaged contact resistance of a plurality of experimental results was 0.30 mΩ·cm$^2$, and a variation was ±0.02 mΩ·cm$^2$.

From the experimental results, when laser annealing is performed using the Ni—P layer, the contact resistance is small on average and the variation is small. From these results, stably low contact resistance can be achieved by laser annealing using the Ni—P layer.

Figure 4:
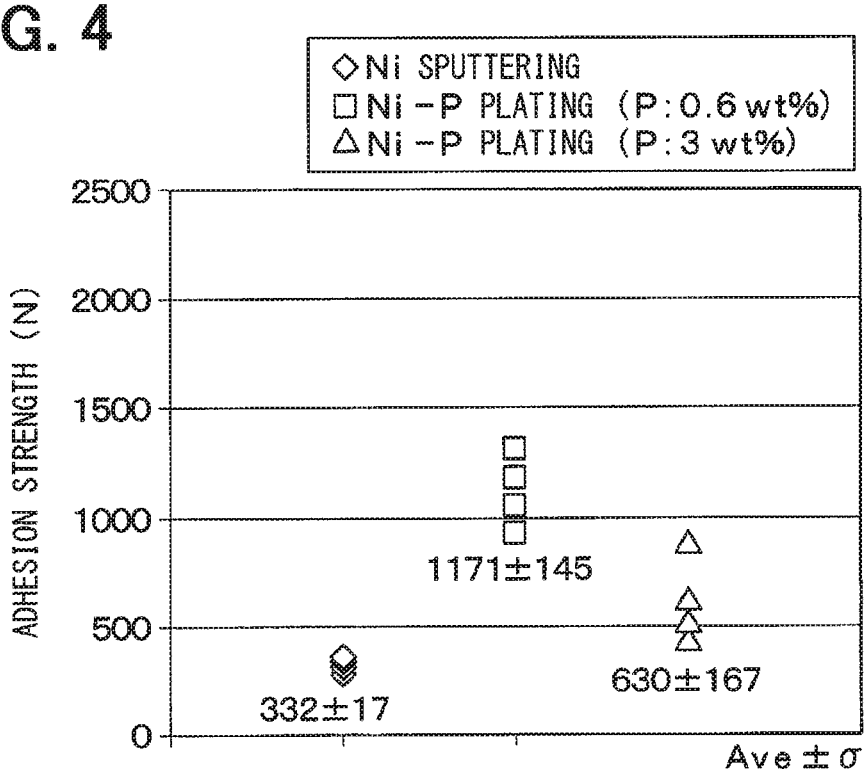
FIG. 4 is a diagram showing adhesion strengths in a case where laser annealing is performed after forming a Ni layer and a case where laser annealing is performed after a Ni—P layer is formed.

Further, when conducting the experiment under the same conditions as in FIG. 3, the adhesion strength between the electrode material and SiC was investigated. The adhesion strength was examined by a tensile strength test in which the electrode material and SiC were pulled in directions opposite to each other and the peeling state between the electrode material and SiC was examined. FIG. 4 is a diagram showing the results.

As shown in FIG. 4, when using the Ni layer, an averaged adhesion strength [N] of a plurality of experimental results was 332 [N], and a variation was ±17 [N]. On the other hand, when the Ni—P layer was used and the P concentration was 0.6 wt %, an averaged adhesion strength of a plurality of experimental results was 1171 [N], and a variation was ±145 [N]. When the Ni—P layer was used and the P concentration was 3 wt %, an averaged adhesion strength of a plurality of experimental results was 630 [N], and a variation was ±167 [N].

According to the experimental results, when the laser annealing was performed using the Ni—P layer, although the variation was large, the adhesion strength as a whole was high, and the adhesion strength was approximately twice as large as the case where the Ni layer was used. From these results, stably high adhesion strength can be achieved by laser annealing using the Ni—P layer.

Figure 5:
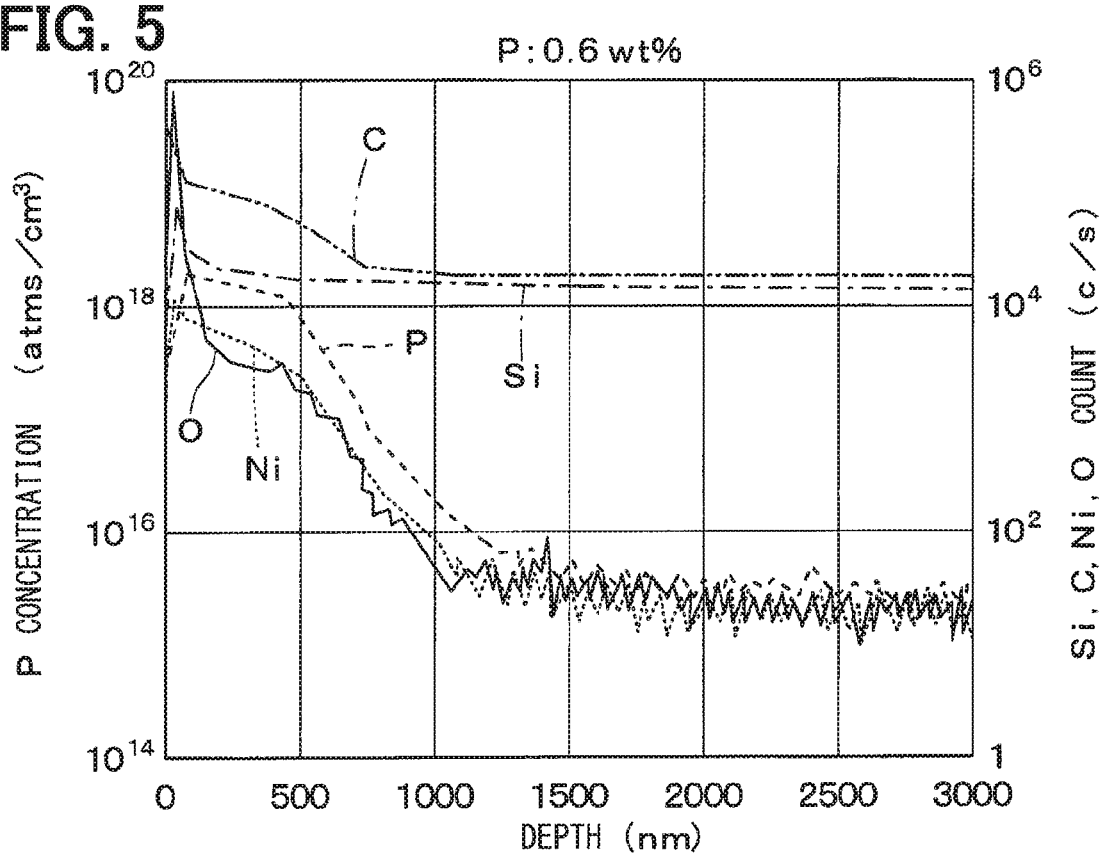
FIG. 5 is a diagram showing results of secondary ion mass spectrometry (hereinafter referred to as SIMS) when a P concentration in the Ni—P layer is 0.6 wt %.
Figure 6:
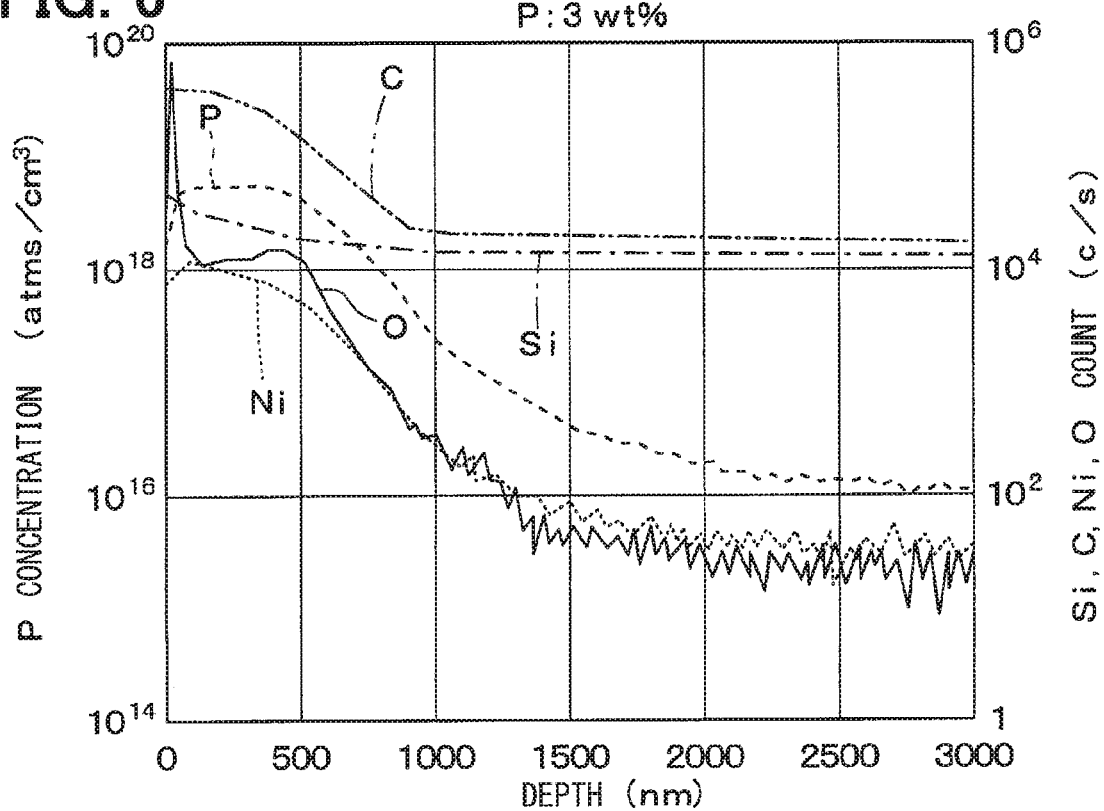
FIG. 6 is a diagram showing results of SIMS when the P concentration in the Ni—P layer is 3 wt %.

A mechanism for the results was also investigated. Specifically, the Ni—P layer was electrolessly plated on the SiC surface, and laser annealing was performed. Then, element concentrations in a depth direction from the surface of the formed silicide layer toward the SiC were examined by SIMS. Similarly, the examinations were carried out in a case where the P concentration in Ni—P layer was 0.6 wt % and a case where the P concentration in Ni—P layer was 3 wt %. In addition, the P concentration in SiC was set to 3.0×10$^{16}$ cm$^{-3}$ so that the change in P concentration could be easily confirmed. FIGS. 5 and 6 show these results.

Figure 7:
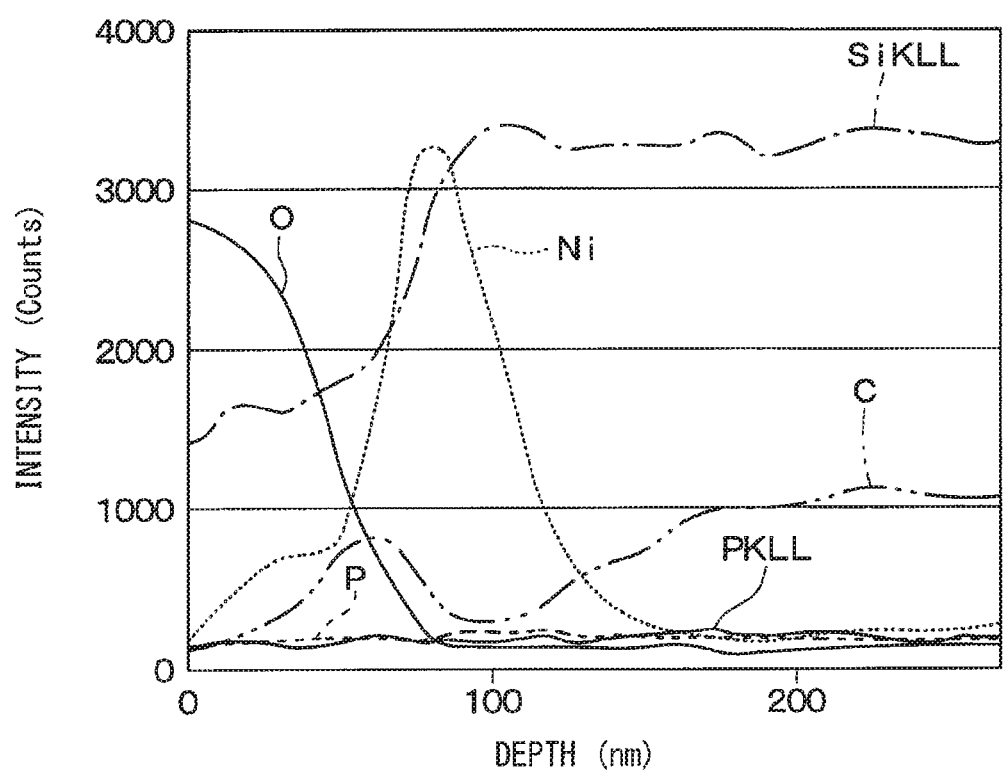
FIG. 7 is a diagram showing a result of examining a structure of a silicide layer by Auger electron spectroscopy (hereinafter referred to as AES)

As can be seen from FIG. 5 and FIG. 6, depth profiles of Ni concentration and P concentration in the silicide layer were almost the same in both cases. This indicates that P is not segregated in the silicide layer, but diffuses similarly to Ni. Analyses by AES were also carried out. FIG. 7 is a diagram showing the results. Also from these results, both P and Ni are diffused and are not segregated. In addition, analyses by transmission electron microscope (TEM) and energy dispersive X-ray (EDX) were also carried out. In both cases, P and Ni were both diffused and no segregation was observed.

Figure 8:
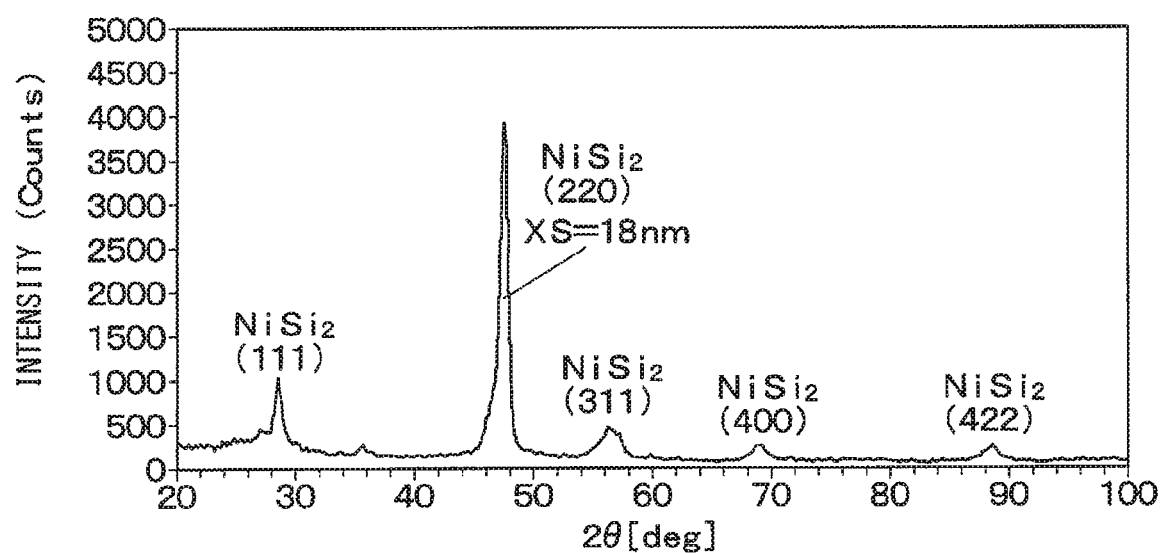
FIG. 8 is a diagram showing a result of examining an electrode structure by an X-ray diffraction device (hereinafter referred to as XRD) after sputtering a Ni layer with 3 wt % of P concentration as an electrode material and then performing laser annealing.
Figure 9A:
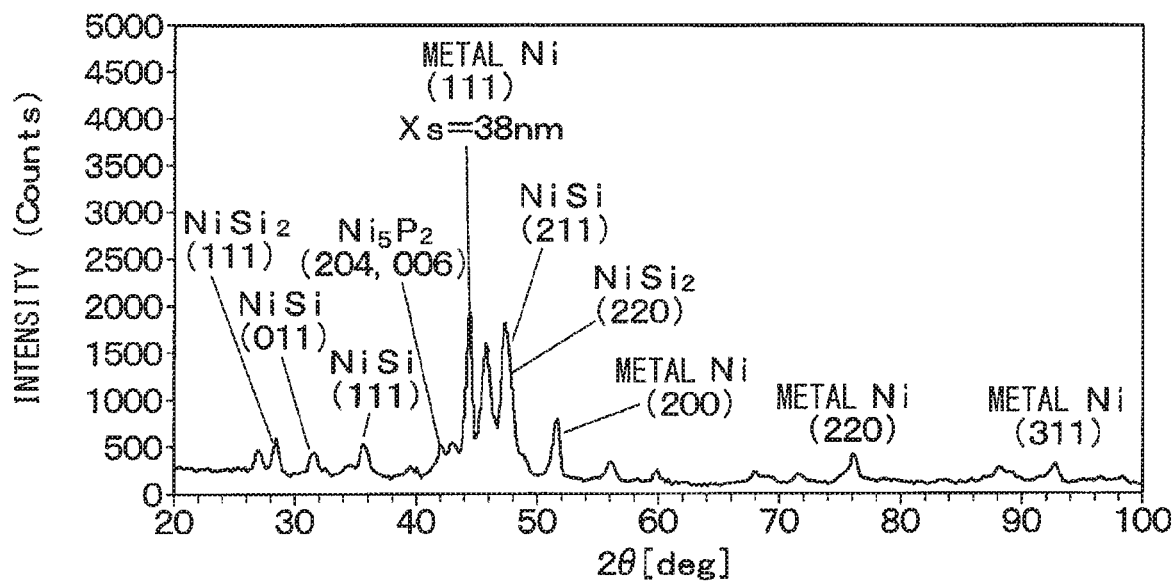
FIG. 9A is a diagram showing a result of examining the electrode structure by XRD after electrolessly plating a Ni—P layer with 3 wt % of P concentration as an electrode material and then performing laser annealing.
Figure 9B:
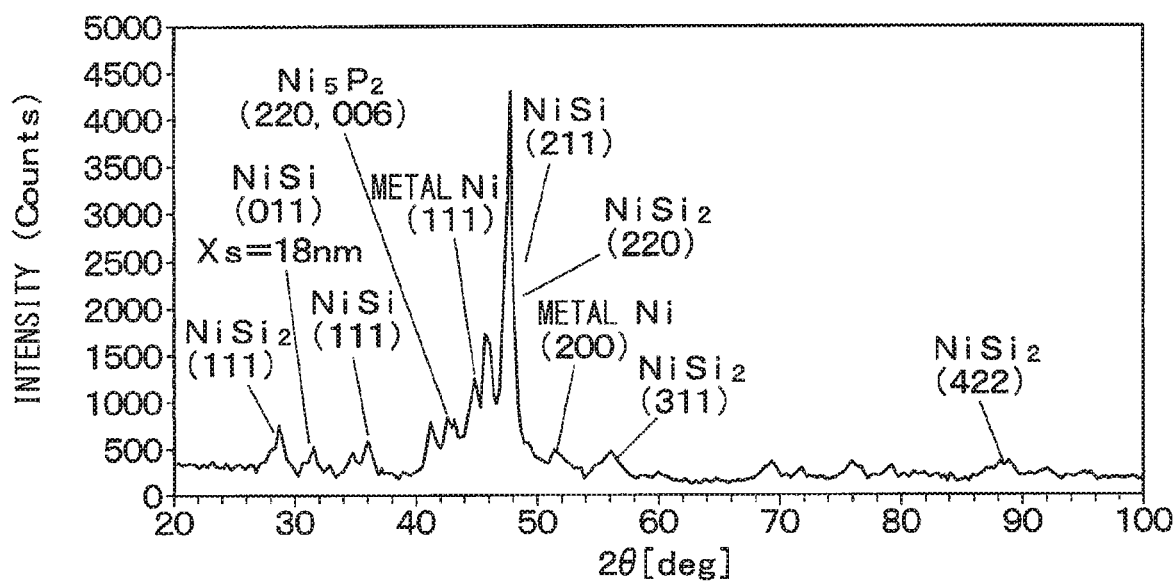
FIG. 9B is a diagram showing a result of examining the electrode structure by XRD after electrolessly plating a Ni—P layer with 11 wt % of P concentration as an electrode material and then performing laser annealing.

Furthermore, in order to clarify the electrode structure, the electrode structure after laser annealing was investigated by XRD in a case where the Ni layer was formed by sputtering as an electrode material and in a case where the Ni—P layer was formed by electroless plating. FIG. 8, FIG. 9A and FIG. 9B show these results.

As shown in FIG. 8, when Ni layer is used, NiSi$_2$ is mainly generated. NiSi$_2$ is a silicide having relatively high contact resistance with SiC. On the other hand, as shown in FIG. 9A and FIG. 9B, when using the Ni—P layer, metal Ni, Ni$_5$P$_2$ and NiSi are generated in addition to NiSi$_2$. Metal Ni is a highly crystalline metal. NiSi is a silicide having a smaller contact resistance with SiC than NiSi$_2$.

From this result, when P is included in Ni, metal Ni having high crystallinity is generated, Ni$_5$P$_2$ is generated, and NiSi is generated instead of NiSi$_2$. The crystallite diameter Xs of the silicide layer was examined by XRD. A large value was obtained as the crystallite diameter Xs and the crystallinity was also high.

Specifically, as shown in FIG. 9B, the crystallite diameter Xs had a large value of 18 nm even when the P concentration was 11 wt %. However, as shown in FIG. 9A, when the P concentration was 3 wt %, the crystallite diameter Xs had a large value of 38 nm, which is larger than 30 nm. From these results, higher crystallite diameter Xs can be obtained by including P in Ni and further higher crystallite diameter Xs can be obtained when the P concentration is 3 wt % or less.

Figure 10:
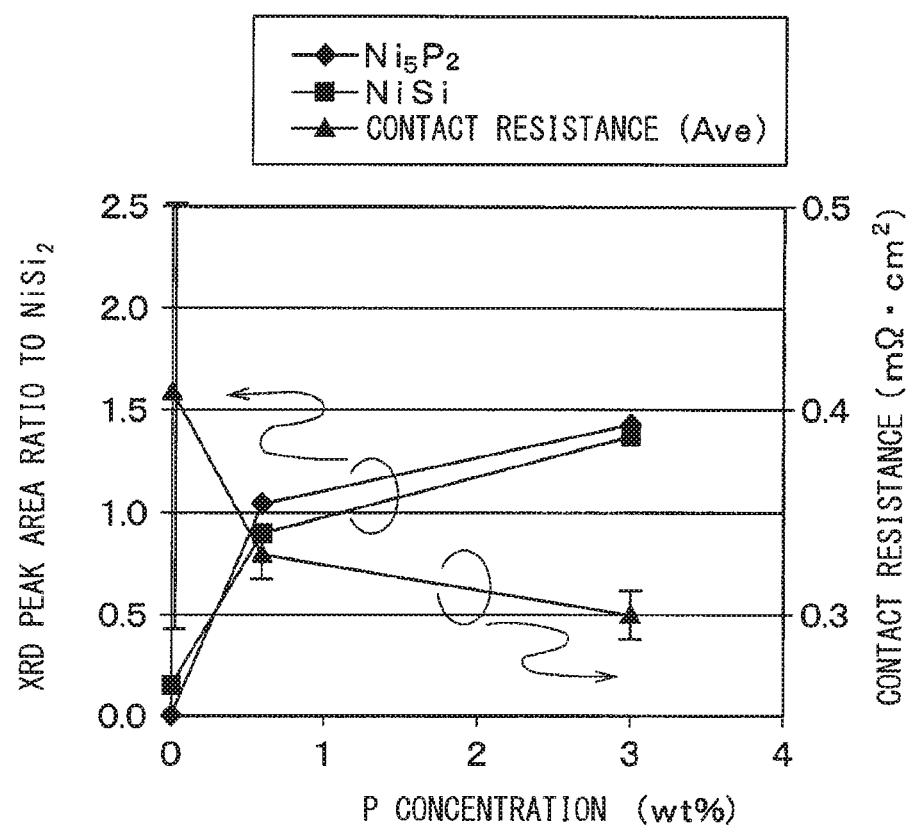
FIG. 10 is a diagram showing contact resistances and proportions of $Ni_5P_2$ and NiSi when varying phosphorus concentration.

Further, by changing the P concentration, the contact resistance and the proportions of Ni$_5$P$_2$ and NiSi were examined. The results are shown in FIG. 10. The proportions of Ni$_5$P$_2$ and NiSi were obtained from the XRD peak area ratio to NiSi$_2$. As shown in FIG. 10, although the contact resistance decreases as the P concentration increases, the metal Ni decreases and the Ni$_5$P$_2$ and NiSi increase.

As shown in FIG. 5 to FIG. 7, P and Ni both diffuse and, as shown in FIG. 10, both Ni$_5$P$_2$ and NiSi increase as the P concentration increases. From these results, the following mechanism is estimated. Ni$_5$P$_2$ is generated and functions like a catalyst to form NiSi. Ni$_5$P$_2$ also functions like a nucleus of crystal growth to improve crystallinity.

Also, as can be seen from the results in FIG. 10, the contact resistance decreases as the P concentration increases, and metal Ni decreases as the P concentration increases. Although the crystallinity of NiSi is high, the crystallinity may be decreased due to the decrease of metal Ni. Therefore, it is preferable to control the P concentration to some extent.

However, there is a correlation with the P concentration and the state of the reaction product formed by the reaction of Ni and P. If the P concentration is high, Ni$_5$P$_2$ is generated even by furnace annealing that heats the entire wafer such as a general heating furnace or lamp annealing. However, Ni$_5$P$_2$ was not generated without performing laser annealing when the P concentration was a relatively low concentration of 15 wt % or less.

That is, when the furnace annealing is performed under the P concentration is 15 wt % or less, $Ni_3P$ was obtained as the reaction product of Ni and P, and $Ni_5P_2$ was not obtained. On the other hand, when laser annealing is performed, $Ni_5P_2$ was obtained as the reaction product of Ni and P. Although the mechanism is unknown, it seems to be because annealing is locally performed at a high temperature such as 1000° C. or more in a short time, when laser annealing is carried out. In fact, analyses of the electrode structure were carried out by both laser annealing and furnace annealing using a heating furnace. In the furnace annealing, metal Ni and $Ni_3P$ were generated, but $Ni_5P_2$ and NiSi were not generated.

Furthermore, a relation between the electrode structure, P concentration and adhesion strength was investigated in more detail. Experiments were conducted under the same conditions as in FIG. 3 and the adhesion strength was measured under the same conditions as in FIG. 4. However, the adhesion strength was measured while changing the P concentration in the Ni—P layer to 3 wt %, 7 wt %, 9 wt % and 11 wt %.

Figure 11:
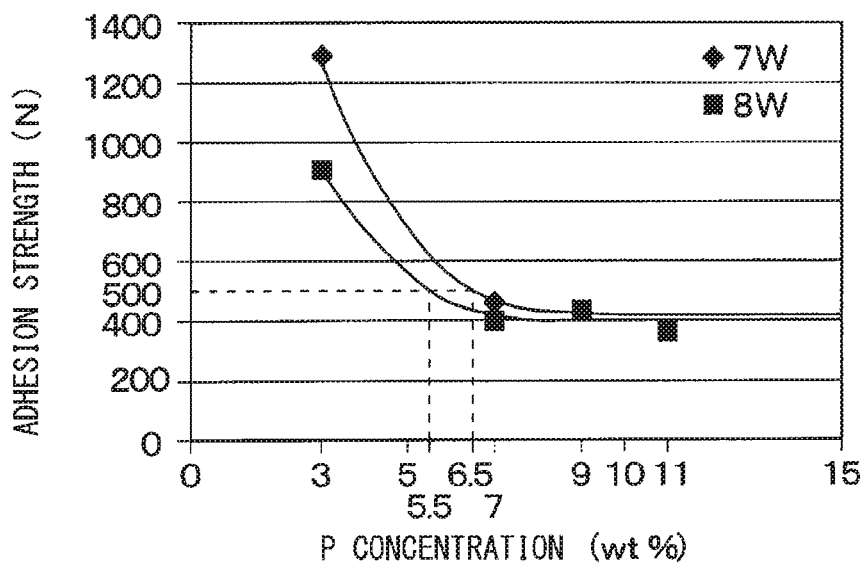
FIG. 11 is a diagram showing measurement results of adhesion strength.

Also, in order to investigate the tendency of change in adhesion strength with respect to laser energy, the adhesion strength was measured while changing the laser energy to 7 W and 8 W in the case where the P concentration is 3 wt % and 7 wt %. FIG. 11 shows the results.

As shown in FIG. 11, when the P concentration was changed to 3 wt %, 7 wt %, 9 wt %, and 11 wt %, the adhesion strength increased as the P concentration decreased. When an approximate curve passing through the adhesion strength at each P concentration was drawn in the case where the laser energy was 8 W, the adhesion strength increased exponentially as the P concentration decreased. From this approximate curve, when the laser energy was 8 W, the P concentration in which the adhesion strength equal to or greater than 500 N can be obtained was 5.5 wt % or less.

When the laser energy was 7 W, similar tendency as in the case of 8 W was obtained. An approximate curve passing through the median value of the adhesion strength at each P concentration was drawn. From the approximate curve, the P concentration in which the adhesion strength equal to or greater than 500 N can be obtained was 6.5 wt % or less.

Here, the used laser energy was 7 W or 8 W. When the laser energy is equal to or less than the used laser energy (i.e., 7 W or 8 W), higher adhesion strength can be obtained with the same P concentration than in the case where the laser energy is 7 W or 8 W. Therefore, when the laser energy is 7 W or less, the adhesion strength equal to or greater than 500 N can be obtained with the P concentration equal to or less than 6.5 wt %. When the laser energy is 8 W or less, the adhesion strength equal to or greater than 500 N can be obtained with the P concentration equal to or less than 5.5 wt %. Note that when the laser energy is 7 W or less, the energy density is equal to or less than 1.4 $J/cm^2$, and the silicidation reaction does not occur sufficiently. Therefore, the laser energy is preferably equal to or greater than 7 W.

Accordingly, when the P concentration is relatively low, high adhesion strength can be obtained. In particular, when the laser energy is 8 W, high adhesion strength equal to or greater than 500 N can be obtained with the P concentration equal to or less than 5.5 wt %. When the laser energy is 7 W, high adhesion strength equal to or greater than 500 N can be obtained with the P concentration equal to or less than 6.5 wt %.

Additionally, cross-sectional TEM images of the interface between SiC and Ni silicide layer showed that graphite was formed at the interface. The graphite was observed in each of the cases where the P concentration was changed.

When Ni is formed on the SiC substrate and Ni silicide is formed by heating, excess carbon is generated as graphite due to the consumption of Si by silicidation. The graphite is known to decrease the adhesion strength of the electrode and cause peeling. For this reason, a method of removing graphite by etching has been proposed. However, with this method, only graphite formed on the electrode surface can be removed, and graphite between the electrode and SiC cannot be removed. That is, desired adhesion strength cannot be obtained.

On the other hand, in the structure of the present embodiment, low resistance and high adhesion strength are obtained as described above even when the graphite is generated. Therefore, the SiC semiconductor device achieving low resistance and high adhesion strength can be obtained without removing graphite.

Figure 12:
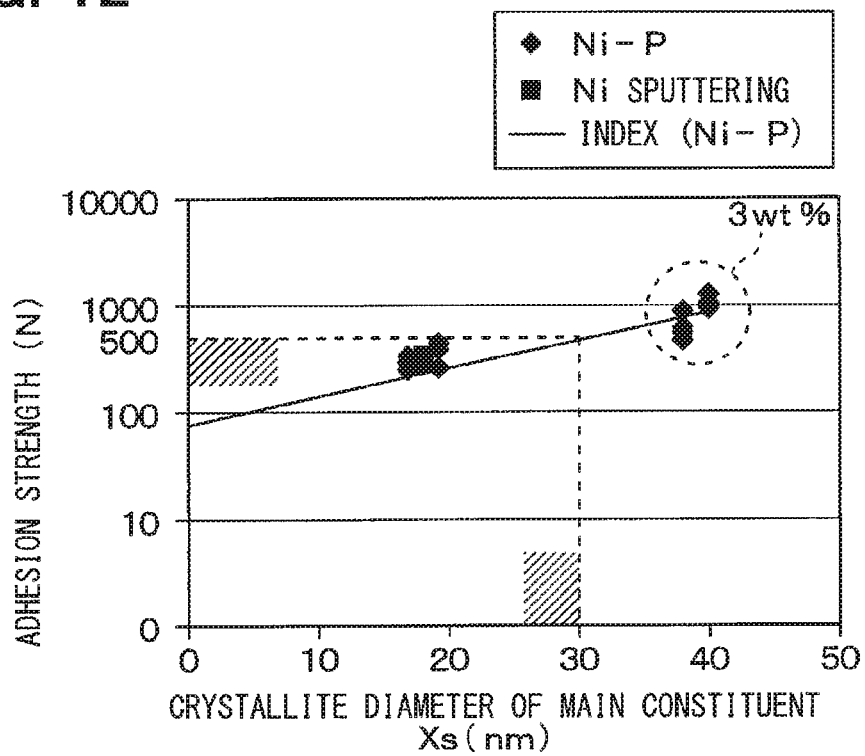
FIG. 12 is a diagram showing a relationship between adhesion strength and a crystallite diameter Xs indicating crystallinity of a main constituent.

A relationship between the crystallite diameter Xs and the adhesion strength [N] was summarized with respect to measurement results and the case where the Ni layer was sputtered. The results are shown in FIG. 12. From the results, when the P concentration in the Ni—P layer was 3 wt %, the crystallite diameter Xs exceeded 30 nm and high adhesion strength equal to or greater than 500 N was obtained.

Accordingly, as in the present embodiment, by forming the drain electrode 11 with laser annealing using the Ni—P layer as the electrode material, better ohmic characteristics can be obtained, and high adhesion strength between the SiC and the electrode can be obtained.

According to the above described embodiment, the drain electrode 11 is formed by using, as the metal thin film 110, a material in which P serving as an impurity is included in Ni forming silicide and by performing laser annealing for the material. Accordingly, better ohmic characteristics can be obtained, and high adhesion strength between the SiC and the electrode can be obtained. Further, in the laser annealing, local annealing in a short time can be performed, so that thermal damage to the device can be suppressed.

Furthermore, when silicide is formed by laser annealing while performing ion implantation, a contact resistance of about 0.2 $m\Omega \cdot cm^2$ can be obtained. Even when the drain electrode 11 is formed as in the present embodiment, a contact resistance of about 0.3 $m\Omega \cdot cm^2$ can be obtained. Therefore, since desired contact characteristics can be obtained without performing the impurity ion implantation, the cost of conducting the ion implantation can be reduced.

Other Embodiments

The present disclosure is not limited to the above described embodiments and may be suitably modified.

(1) For example, in the first embodiment, the ohmic electrode is described to be formed on the rear surface of the SiC substrate of the device having components on the front surface. However, the structure described in the first embodiment is not applied only to the rear surface of the SiC substrate of the device having components on the front surface. The structure may be applied to any part as far as forming ohmic electrode on SiC. For example, the structure may be applied to a case where an ohmic electrode is formed on the front surface of the SiC substrate. Also in this case, when forming the ohmic electrode after forming the components of the device, laser annealing is performed. As a result, local heating can be performed to suppress the influence for the device.

In the above embodiment, Ni is used as the electrode metal and Mo is used in addition to Ni. Furthermore, Ti or the like may be added to these examples. For example, after Ti or the like is formed on the SiC surface, Ni—P layer may be formed or Mo layer and Ni—P layer may be sequentially formed, and then laser annealing may be performed.

(2) In the first embodiment, the solid laser is used as an example of the laser annealing. However, the laser annealing is not limited to the solid laser, and, for example, an excimer laser or the like may be used. When using the excimer laser, the energy density is preferably 1.4 J/cm$^2$ or more while using a wavelength of 248 nm or 308 nm, for example.

(3) In the above embodiment, the example where the Ni—P layer is formed by electroless plating has been described. However, when the Ni—P layer is formed by plating, the Ni—P layer may be formed not only on the rear surface of the SiC substrate but also on the front surface at the same time. For example, when forming a vertical power MOSFET as a SiC semiconductor element as in the above embodiment, the Ni—P layer for the source electrode 10 may be formed simultaneously with forming the Ni—P layer as the metal thin film 110 for the drain electrode 11. In this way, the electrode forming step can be simplified.

(4) In the first embodiment, the SiC semiconductor device including the vertical power MOSFET as the semiconductor element has been described as an example. However, this configuration is merely an example, and other semiconductor element such as a diode and an IGBT may be included. That is, any SiC semiconductor device may be used as far as having an ohmic electrode for a semiconductor element formed on a SiC semiconductor substrate.

Although the present disclosure is described based on the above embodiments, the present disclosure is not limited to the embodiments and the structures. Various changes and modification may be made in the present disclosure. Furthermore, various combination and formation, and other combination and formation including one, more than one or less than one element may be made in the present disclosure.

What is claimed is:

1. A silicon carbide semiconductor device comprising:
a silicon carbide semiconductor substrate that has a front surface and a rear surface; and
an ohmic electrode that is in ohmic contact with silicon carbide of at least one of the front surface or the rear surface of the silicon carbide semiconductor substrate, wherein:
the ohmic electrode is made of Ni containing 0.1 wt % or more and 15 wt % or less of P as an impurity,
the ohmic electrode contains Ni silicide including NiSi,
the ohmic electrode further contains $Ni_5P_2$ as an only compound of Ni and P in the Ni silicide, and
the $Ni_5P_2$ is a catalyst in generating the NiSi.

2. The silicon carbide semiconductor device according to claim 1, wherein
the ohmic electrode further contains unreacted metal Ni.

3. The silicon carbide semiconductor device according to claim 1, wherein
the ohmic electrode further contains Mo.

4. The silicon carbide semiconductor device according to claim 3, wherein
the ohmic electrode further contains Mo carbide.

5. The silicon carbide semiconductor device according to claim 1, wherein
a crystallite diameter of the ohmic electrode measured by an X-ray diffraction apparatus is 30 nm or more.

6. The silicon carbide semiconductor device according to claim 1, wherein
the ohmic electrode further contains Ti.

7. A silicon carbide semiconductor device comprising:
a silicon carbide semiconductor substrate that has a front surface and a rear surface; and
an ohmic electrode that is in ohmic contact with silicon carbide of at least one of the front surface or the rear surface of the silicon carbide semiconductor substrate, wherein:
the ohmic electrode is made of Ni containing 0.1 wt % or more and 15 wt % or less of P as an impurity,
the ohmic electrode contains Ni silicide including NiSi and $NiSi_2$,
NiSi is more than 0.9 times $NiSi_2$ in a peak area of X-ray diffraction device (XRD) analysis,
the ohmic electrode further contains $Ni_5P_2$ in the Ni silicide, and
the $Ni_5P_2$ is a catalyst in generating the NiSi.

* * * * *